United States Patent [19]
Behlen et al.

[11] Patent Number: 5,598,033
[45] Date of Patent: Jan. 28, 1997

[54] MICRO BGA STACKING SCHEME

[75] Inventors: James F. Behlen, Sunnyvale; Rafiqul Hussain, Fremont; Munir Haq, San Jose, all of Calif.

[73] Assignee: Advanced Micro Devices, Inc., Sunnyvale, Calif.

[21] Appl. No.: 543,678

[22] Filed: Oct. 16, 1995

[51] Int. Cl.⁶ .................................................. H01L 23/02
[52] U.S. Cl. ........................... 257/686; 257/723; 257/778
[58] Field of Search .................................... 257/723, 785, 257/702, 778, 737, 685, 668, 686

[56] References Cited

U.S. PATENT DOCUMENTS 5,311,407  5/1994  Lumbard ............................... 257/723
5,434,452  7/1995  Higgins, III .......................... 257/785

FOREIGN PATENT DOCUMENTS 63-158860  7/1988  Japan ................................. 257/723
2-224266   9/1990  Japan ................................. 257/723

*Primary Examiner*—Sara W. Crane
*Assistant Examiner*—Roy Potter
*Attorney, Agent, or Firm*—Davis Chin

[57] ABSTRACT

There is provided an improved stacking scheme for micro-BGA packages so as to provide a high density integrated circuit package. The integrated circuit package assembly (300) includes a sheet-like interposer (312) which is formed of a main portion (312a) and an extension (312b) extending outwardly from the main portion. A plurality of lands (326) are disposed on the surface of the interposer extension. A plurality of masses (314) of electrically conductive bonding material of each of a plurality of packages overlie the lands on the interposer extension of the next lower package and are electrically connected thereto when the plurality of packages are stacked one atop the other.

16 Claims, 3 Drawing Sheets

MICRO BGA STACKING SCHEME

BACKGROUND OF THE INVENTION

This invention relates generally to semiconductor integrated circuit packaging and more particularly, it relates to an improved stacking scheme for micro-BGA (ball grid array) packages so as to provide a high density integrated circuit package.

In view of the rapid advancement made in the area of integrated circuit microprocessors, there have been developed a number of complex systems which utilize a variety of integrated circuit memory devices such as DRAMs and FLASH ROMs. As a result of the improved methods for miniaturization of integrated circuits containing millions of circuit elements on a single chip, there has arisen a need for enhanced packaging technology for the integrated circuits so as to package them in a relatively small amount of space. Heretofore, there are known in the prior art of various methods and apparatus for achieving high density integrated circuit packages.

As is generally known to those in the package and interconnection industry, there exists a high level of interest in the area of ball grid array (BGA) package and assembly technology. In this field of BGA technology, there are included plastic ball grid array (PBGA) packages, multilayer ceramic ball grid array (CBGA) packages, tape automated bonding (TAB) BGA packages, and ball grid array-like packages. The ball grid array-like packages are variations of the BGA theme and consist of SLICC, mini-BGA, and TCC. The TCC (Tessera Compliant Chip) is a chip array package developed by Tessera, Inc. of Elmsford, N.Y., and is also referred to as a micro-BGA.

In U.S. Pat. No. 5,258,330 to I. Y. Khandros and T. H. DiStefano issued on Nov. 2, 1993, and entitled "Semiconductor Chip Assemblies With Fan-In Leads," there is disclosed a semiconductor packaging technique utilizing a flexible circuit connected to the surface of the chip to provide the medium for routing the I/O contact pads of the chip into an array of bumps. FIG. 1 of the drawings of the instant patent application shows a prior art semiconductor chip package which is similar to the one in the '330 patent.

As can be seen from FIG. 1, a sheet-like dielectric interposer 36 is assembled to the semiconductor chip 20. The interposer 36 includes a flexible layer 38 and a compliant layer 40. A plurality of central terminals 48 are distributed over the surface 44 of the flexible layer 38 at substantial even spaces so as to define an "area array." The dimensions of the interposer 36 in the plane of the surface 44 are smaller than the corresponding dimensions of the chip 20 in the plane of its surface 22. As a result, the edges of the interposer are disposed inwardly of the rows of peripheral contacts 30 on the chip 20. Fine, flexible bonding wires 56 are applied in a wire bonding operation so as to connect electrically the peripheral contacts 30 on the chip 20 to the central terminals 48 via bonding terminals 52 and partial leads. Then, the chip 20, interposer 36 and bonding wires 56 are encapsulated in a conventional process so as to provide a durable assembly which can be easily handled.

Next, the chip and interposer subassembly is juxtaposed with a substrate 66 having electrical contact pads 68 formed thereon. The subassembly is placed onto the substrate so that each of the central terminals 48 faces toward and are aligned with corresponding electrical contact pads 68 on the substrate 66. Masses of an electrically conductive bonding material 70 such as solder or an electrically conductive adhesive is disposed between the central terminals 48 and the contact pads 68 of the substrate. The masses are caused to flow and to bond with the central terminals and the contact pads so as to form mechanical and electrical connections therebetween.

Since each of the peripheral contacts 30 on the chip 20 is connected to one of the central terminals 48 on the interposer 36 and since each of the central terminals 48 is further connected to one of the contact pads 68 on the substrate 66, then each peripheral contact 30 will be connected electrically to one of the contact pads 68. Further, the contact pads on the substrate can also be connected to other circuit elements through conventional connections when the substrate is a printed circuit board containing various electrical components besides the chip 20.

In order to provide a quick and cost-effective way to securely bind together a stack of individual integrated circuits, the '330 patent also disclosed a circuit assembly which includes a plurality of chip assemblies so as to form a larger multi-chip circuit assembly. FIG. 2 of the drawings of the instant patent application shows a prior art multi-chip circuit assembly which is similar to the one in the '330 patent. As shown in FIG. 2, a plurality of chip assemblies, each consisting of a chip 620, an interposer 636 and a sheet-like backing element 660, are arranged in a stack one atop the other, with the backing element 660 of each chip assembly overlying the interposer 636 of the next lower chip assembly other than the bottommost chip assembly.

It can be seen that in each chip assembly the interposer 636 overlies a central region of the chip 620 and has its central terminals 648 connected to the peripheral contact 630 of the chip by leads 650. The leads 650 have outer extensions 654 extending outwardly beyond the peripheral contact 630 and beyond the edges of the chip. The backing element 660 also extends outwardly beyond the edges of the chip and has outside terminals 666 dispose outboard of the chip edges on its top surface 662. The outward extension 654 of the leads 650 from the interposer 636 are connected to outside terminals 666 of the backing element and are secured thereto. The outside terminals 666 are electrically connected to inside terminals 668 disposed on the bottom surface 664 of the backing element. The inside terminals 668 are disposed in the central region of the backing element and have a pattern similar to the pattern of the central terminals 648 on the interposer 636.

The inside terminals 668 on the backing element of each chip assembly are aligned with the central terminals 648 on the interposer 636 of the immediate subjacent (next lower) chip assembly. Thus, these aligned terminals are mechanically and electrically connected to one another by masses of electrically conductive bonding materials 670 such as solder or electrically conductive adhesive. In this manner, the leads and contacts of the various chip assemblies are electrically connected to one another, thereby connecting the chips to one another. Moreover, the multi-chip circuit assembly can be further connected to a larger substrate by either bonding the central terminals 648 on the interposer 636 of the topmost chip assembly to a substrate or bonding the inside terminals 668 on the lowermost chip assembly to a substrate.

The inventor of the present invention has developed a way to easily modify the micro-BGA package of the prior art of FIG. 1 in order to facilitate stacking of the same without the need of the backing element 660 for each chip assembly. The unique stacking scheme of the present invention has particular applications for use with integrated circuit memory chips such as flash memory chips so as to achieve a high density package. The modified micro-BGA package can be stacked in a relatively small amount of area on a printed circuit board. Further, there is provided a unique signal line routing scheme to each of the layers of the stacked package.

SUMMARY OF THE INVENTION

Accordingly, it is a general object of the present invention to provide an improved method and apparatus for stacking a plurality of micro-BGA packages.

It is an object of the present invention to provide an improved stacking scheme for micro-BGA packages so as to produce a high density integrated circuit package.

It is another object of the present invention to provide a method of fabricating a multi-chip circuit assembly containing a plurality of micro-BGA packages.

It is still another object of the present invention to provide an integrated circuit package assembly containing a plurality of micro-BGA packages stacked atop one another to produce a high density integrated circuit package.

It is yet still another object of the present invention to provide a signal line routing scheme to each of the layers of a stacked package containing a plurality of micro-BGA packages.

In accordance with these aims and objectives, the present invention is concerned with the provision of an integrated circuit package assembly which includes a semiconductor chip having a top surface. The chip has a plurality of peripheral contacts disposed on the top surface. A sheet-like interposer is provided which overlies the top surface of the chip. The interposer has a first surface facing toward the chip and a second surface facing away from the chip. The interposer is formed of a main portion and an extension extending outwardly from the main portion.

A plurality of central terminals are disposed on the main portion of the interposer. The central terminals face away from the chip and are exposed at the second surface of the interposer. A plurality of masses of electrically conductive bonding material are connected to corresponding ones of the plurality of central terminals. A plurality of lands are disposed on the second surface and are electrically connected to corresponding ones of the plurality of masses.

In another aspect of the present invention, a plurality of micro-BGA integrated circuit packages are stacked one atop the other. When stacked, the masses of each of the plurality of the micro-BGA integrated circuit packages overlie the lands on the interposer extension of the next lower integrated circuit package and are electrically connected thereto.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 3:
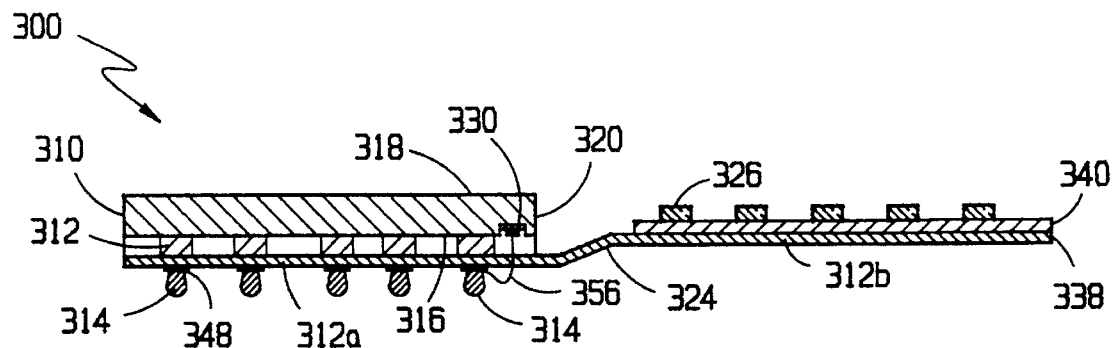
FIG. 3 is a cross-sectional view of an improved micro-BGA package, constructed in accordance with the principles of the present invention.

Referring now to FIG. 3, there is shown a cross-sectional view of a modified micro-BGA (Ball Grid Array) integrated circuit package assembly 300 constructed in accordance with the principles of the present invention. The package assembly 300 is comprised of a semiconductor die or chip 310, an interposer 312 and solder bumps 314. The semiconductor chip 310 is preferably a memory die, such as a sixteen-megabyte FLASH ROM, which has length and width dimensions of approximately 10 mm×10 mm and a height dimension of approximately 6 mils. The substantially square-shaped chip has a generally planar top surface 316, a generally planar bottom surface 318 extending substantially parallel to the top surface and edges 320 extending between the top and bottom surfaces. As shown, the top surface 316 of the semiconductor chip faces down and is mounted to a first surface 322 of the interposer 312.

The other surface 324 of the interposer 312 has central terminals (348) disposed thereon. Further, the bonding wires (356) are used to electrically connect the peripheral contacts (330) on the chip to a corresponding one of the central terminals. The interposer is defined by a micro-BGA tape, similar to the interposer in the '330 patent, and is comprised of a compliant layer (340) and a flexible layer (338) on which is formed the central terminals (348). The flexible layer (338) is formed of a high-modulus material such as polyimide or other thermoset polymer. The compliant layer (340) is formed of a low-modulus material such as an elastomer. The solder bumps 314 are finished with eutectic solder balls, preferably 60% Sn and 40% Pb so as to reflow during the final assembly process for joining the balls both to the package assembly and to the next-level board.

Figure 1:
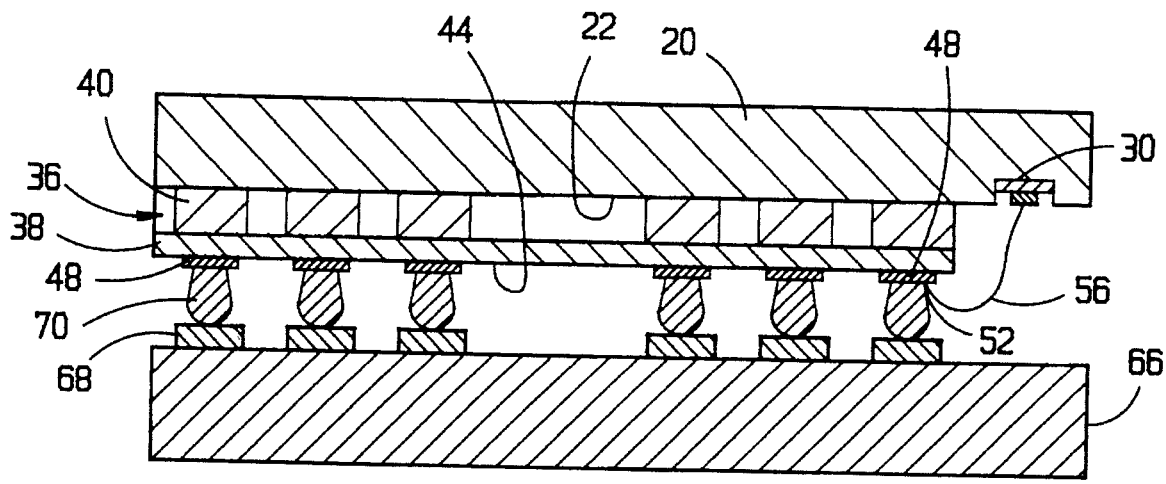
FIG. 1 is a cross-sectional view of a prior art micro-BGA package.
Figure 2:
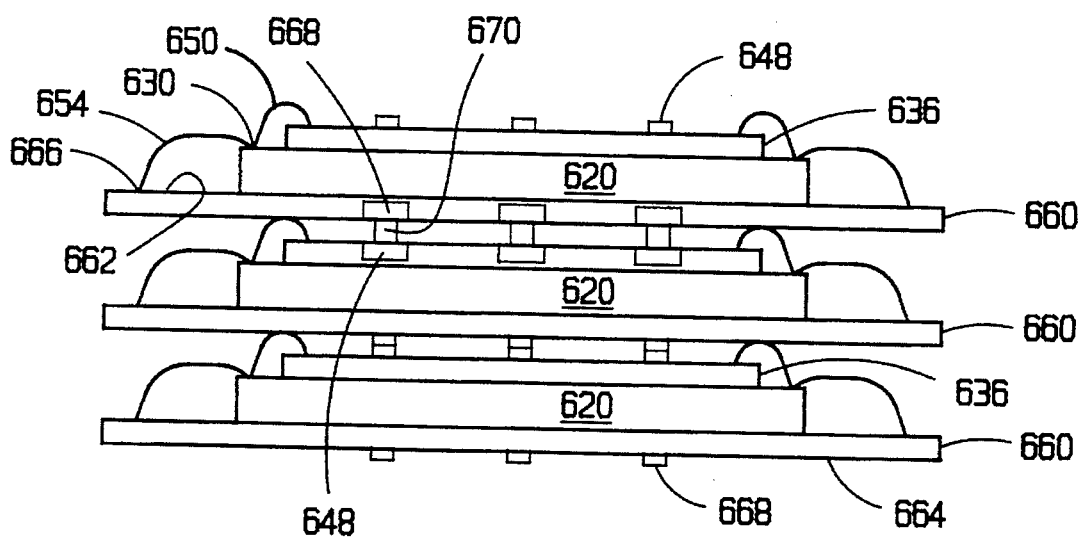
FIG. 2 is a diagrammatical elevational view, depicting a plurality of micro-BGA packages of FIG. 1 which are stacked one atop the other.

Except for the interposer 312, the micro-BGA integrated circuit package assembly 300 is substantially identical to the prior art semiconductor chip assembly shown in FIG. 1. The inventor has developed a technique for modifying the interposer of FIG. 1 so as to produce a very efficient and effective means for stacking a plurality of identical integrated circuit memory chips to form a high density multi-chip packaging assembly. The present invention represents a significant improvement over the stacking technique of the prior art shown in FIG. 2 since it has eliminated the need of manufacturing a backing element for electrically connecting to one another the various chip assemblies.

As shown in FIG. 3, the interposer includes a main portion 312a and an outward extension 312b which extends outwardly from one of the edges of the semiconductor chip. The length dimensions of the interposer 312 in the plane of the first surface 322 are slightly larger than twice the corresponding length dimensions of the chip in the plane of the top surface 316. The width dimension of the interposer is substantially equal to the corresponding width dimension of the chip. For example, a 16M (sixteen-megabyte) memory die has length and width dimensions of approximately 10 mm×10 mm. Thus, the corresponding interposer 312 has length and width dimensions of approximately 23 mm×10 mm.

A plurality of electrically conductive contact pads or metal lands 326 are disposed on the first surface 322 of the interposer outward extension 312b. Each of these lands on the surface 322 are mechanically and electrically connected to a corresponding one of the central terminals (348) formed in the surface 324. The solder bumps 314 are joined to each of the central terminals. The solder bumps 314 on each package assembly 300 other than the lowermost package assembly are aligned with the lands 326 on the interposer of the immediate subjacent (next lower) package assembly. Consequently, as shown in FIG. 4, when the plurality of package assemblies 300 are stacked one atop the other, with the solder bumps of each package assembly overlying the lands on the interposer of the next lower package assembly, all of the various package assemblies are connected one to another.

The solder bumps 314 on the bottommost package assembly of the multi-chip package assembly are aligned and bonded to contact pads (368) on a substrate 328 such as a printed circuit board. It should be understood that the contact pads on the printed circuit board can be connected to other elements of an electrical circuit through conventional metallized conductive traces formed on the surface of the printed circuit board.

Figure 4:
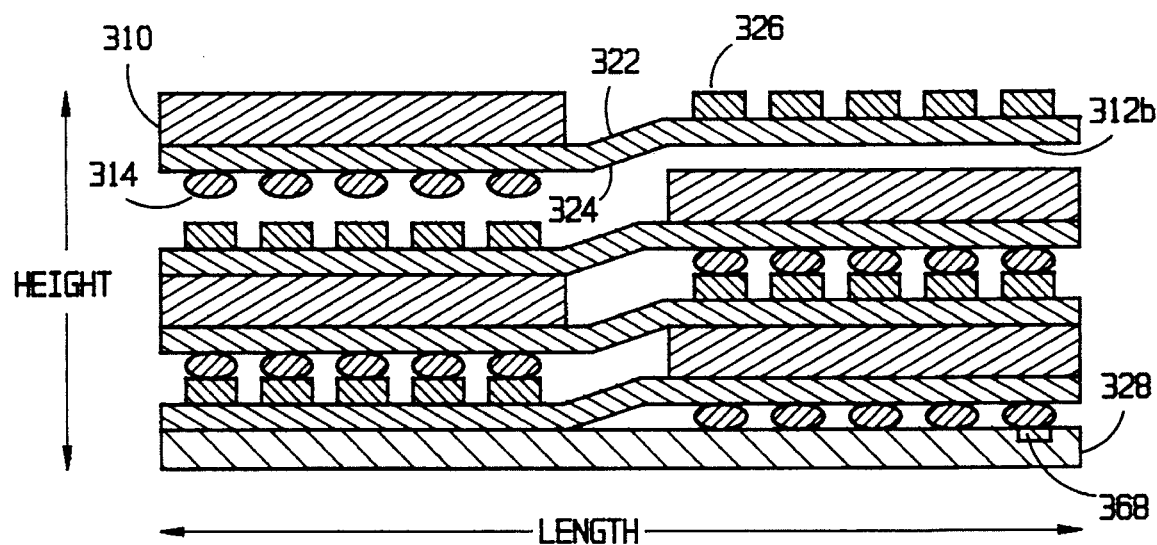
FIG. 4 is a diagrammatical elevational view, depicting a plurality of micro-BGA packages of FIG. 3 which are stacked in accordance with the stacking scheme of the present invention.
Figure 5:
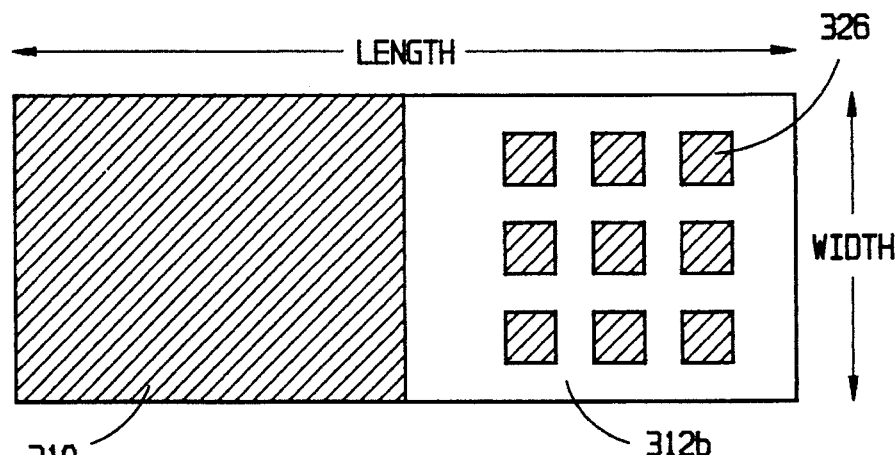
FIG. 5 is a top plan view of the stacked assembly of FIG. 4.

As illustrated in FIGS. 4 and 5, the multi-chip package assembly fabricated in accordance with the present stacking scheme is particularly useful with memory chips such as random access memory chips. The plurality of package assemblies 300 can be stacked in a relatively small area equal to the size of the printed circuit board. It will be noted that the outward extension 312b of the interposer of alternate layers are positioned on opposite sides of the printed circuit board so as to form a zig-zag pattern. Thus, it is possible to form the multi-chip package assembly containing a plurality of identical micro-BGA package assemblies 300 which can be stacked to any desired height. For instance, the two chip high, four chip stack of 16M each shown in FIG. 4 has a height of approximately 2 mm which form a 64M memory device. In an alternate embodiment, it should be understood to those skilled in the art that two dies could be provided in each layer so as to form a two-wide die stack. Thus, FIG. 4 could be easily transformed into a 128M version.

Figure 6:
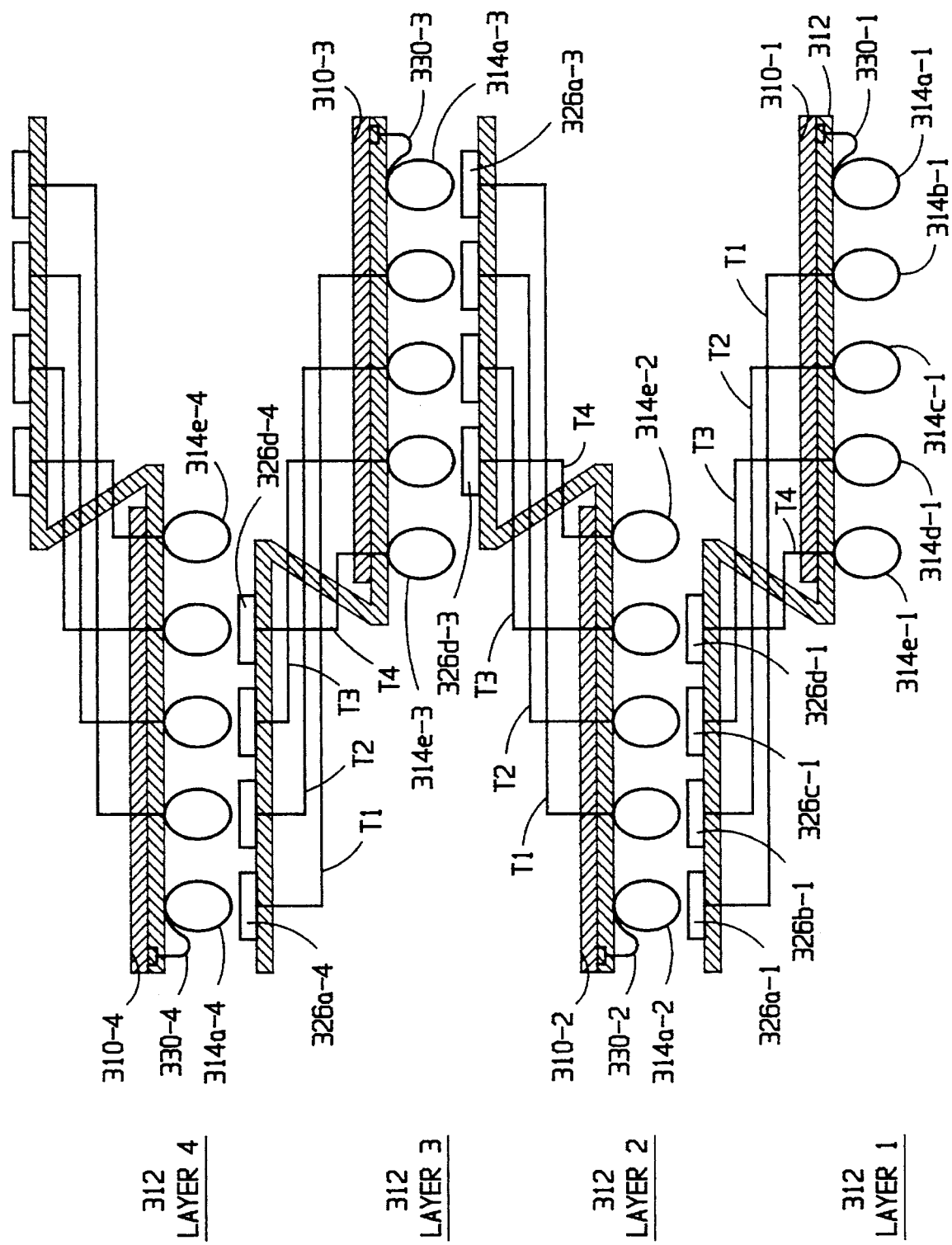
FIG. 6 is a diagrammatical elevational view, illustrating the signal line routing scheme for the stacked micro-BGA package assembly of FIG. 4.

In FIG. 6, there is shown a layout for the signal routing scheme for the micro-BGA stacked packaging assembly of FIG. 4, illustrating the electrical connections between the solder bumps and the lands on each layer through the interposer (polyimide tape). With reference to the first (layer 1) or bottommost layer, there are provided the solder bumps 314a-1, 314b-1, 314c-1, 314d-1, and 314e-1. Since there must be at least one solder bump representing a signal line in each layer connected to the die or chip, the solder bumps 314a-1, 314a-2, 314a-3 and 314a-4 for the corresponding layers will be assumed to be a signal line. Thus, the solder bumps 314a-1 through 314a-4 are connected to their respective dies 310-1 through 310-4 via central terminals (not shown) on the interposer and bonding wires 330-1 through 330-5.

In order to route the signal lines on each layer out to the solder bumps 314a-1 through 314e-1 on the bottom layer, there has been developed a unique pattern for connection between the solder bumps and the lands so as to be the same for each layer. In particular, the solder bump 314a-1, which is the outermost one on the bottom layer, is left unconnected to any of the lands 326a-1 through 326d-1 on the second layer (layer 2). The next adjacent outermost bump 314b-1 is connected via an electrically conductive lead or trace T1 to the land 326a-1, which is the outermost one on the second layer. The next adjacent bump 314c-1 is connected via an electrically conductive trace T2 to the land 326b-1, which is the next adjacent outermost land in the second layer. Further, the bump 314d-1 is connected via an electrically conductive trace T3 to the next adjacent outermost land 326c-1. Finally, the bump 314e-1 is connected via an electrically conductive trace T4 to the next adjacent outermost land 326b-1.

It can be seen that this pattern is identical for each of the remaining layers 2, 3 and 4. As a result, the bump 314a-1 is connected to a signal line on the die 310-1. The bump 314b-1 is connected to a signal line on the die 310-2 via the trace T1, land 326a-1 and bump 314a-2. The bump 314c-1 is connected to a signal line on the die 310-3 via the trace T1 associated with the layer 2 and the trace T2 associated with the layer 1. Similarly, the bump 314d-1 is connected to die 310-4 via the trace T1 associated with the layer 3, trace T2 associated with the layer 2, and trace T3 associated with the layer 1.

From the foregoing detailed description, it can thus be seen that the present invention provides an improved stacking scheme for micro-BGA package assembly so as to provide a high density integrated circuit package. The integrated circuit package assembly of the present invention includes a sheet-like interposer which is formed of a main portion and an extension which extends outwardly from the main portion. A plurality of lands are disposed on the surface of the interposer extension for electrical connection to another package assembly.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An integrated circuit package assembly comprising:

a semiconductor chip (310) having a top surface, said chip having a plurality of peripheral contacts (330) disposed on said top surface;

a sheet-like interposer (312) being formed of a main portion (312a) and an extension (312b) extending outwardly from said main portion, said interposer having a first surface facing toward said chip and a second surface facing away from said chip;

said interposer having a length dimension in the plane of the first surface which is slightly larger than twice a corresponding length dimension of said chip in the plane of the top surface and having a width dimension which is substantially equal to a corresponding width dimension of said chip;

only said main portion of said interposer overlying said top surface of said chip with said extension thereof extending outwardly from an edge of said chip;

a plurality of central terminals (348) disposed on said main portion of said interposer, said central terminals facing away from said chip and being exposed at said second surface of said interposer;

a plurality of masses (314) of electrically conductive bonding material being connected to corresponding ones of said plurality of central terminals;

a plurality of lands (326) disposed in side-by-side relationship on said extension on said first surface of said interposer and being electrically connected to corresponding ones of said plurality of masses; and said plurality of masses being connected in a pattern so that the outermost mass is unconnected to any of said plurality of lands, the first adjacent outermost mass is connected to the outermost land, the second adjacent outermost mass is connected to the first adjacent outermost land, and each subsequent next adjacent outermost mass is connected to a corresponding next adjacent outermost land.

2. An integrated circuit package assembly as claimed in claim 1, wherein said semiconductor chip is comprised of a sixteen-megabyte memory chip.

3. An integrated circuit package assembly as claimed in claim 1, wherein said interposer is comprised of a polyimide flexible tape.

4. An integrated circuit package assembly as claimed in claim 1, wherein said plurality of masses of electrically conductive material is comprised of eutectic solder bumps.

5. An integrated circuit package assembly as claimed in claim 4, wherein said solder bumps is comprised of 60% Sn and 40% Pb.

6. An integrated circuit package assembly as claimed in claim 1, wherein said interposer is comprised of a compliant layer and a flexible layer, said flexible layer having said central terminals formed thereon.

7. An integrated circuit package assembly as claimed in claim 6, wherein said compliant layer is comprised of a low-modulus material and said flexible layer is comprised of a high-modulus material.

8. An integrated circuit package assembly as claimed in claim 1, wherein said plurality of lands are comprised of electrically conductive contact pads.

9. A multi-chip circuit package assembly comprising:

a plurality of micro-BGA integrated circuit packages (300), each including;

a semiconductor chip (310) having a top surface, said chip having a plurality of peripheral contacts (330) disposed on said top surface;

a sheet-like interposer (312) being formed of a main portion (312a) and an extension (312b) extending outwardly from said main portion, said interposer having a first surface facing toward said chip and a second surface facing away from said chip;

said interposer having a length dimension in the plane of the first surface which is slightly larger than twice a corresponding length dimension of said chip in the plane of the top surface and having a width dimension which is substantially equal to a corresponding width dimension of said chip;

only said main portion of said interposer overlying said top surface of said chip with said extension thereof extending outwardly from an edge of said chip;

a plurality of central terminals (348) disposed on said main portion of said interposer, said central terminals facing away from said chip and being exposed at said second surface of said interposer;

a plurality of masses (314) of electrically conductive bonding material being connected to corresponding ones of said plurality of central terminals;

a plurality of lands (326) disposed in side-by-side relationship on said extension on said first surface of said interposer and being electrically connected to corresponding ones of said plurality of masses;

said plurality of masses being connected in a pattern so that the outermost mass is unconnected to any of said plurality of lands, the first adjacent outermost mass is connected to the outermost land, the second adjacent outermost mass is connected to the first adjacent outermost land, and each subsequent next adjacent outermost mass is connected to a corresponding next adjacent outermost land;

said masses of each of said plurality of packages overlying the lands on the interposer extension of the next lower package and being electrically connected thereto when said plurality of packages are stacked one atop the other; and said extension of said interposer of adjacent packages being stacked in a zig-zag pattern.

10. An integrated circuit package assembly as claimed in claim 9, wherein said semiconductor chip is comprised of a sixteen-megabyte memory chip.

11. An integrated circuit package assembly as claimed in claim 9, wherein said interposer is comprised of a polyimide flexible tape.

12. An integrated circuit package assembly as claimed in claim 9, wherein said plurality of masses of electrically conductive material is comprised of eutectic solder bumps.

13. An integrated circuit package assembly as claimed in claim 12, wherein said solder bumps is comprised of 60% Sn and 40% Pb.

14. An integrated circuit package assembly as claimed in claim 9, wherein said interposer is comprised of a compliant layer and a flexible layer, said flexible layer having said central terminals formed thereon.

15. An integrated circuit package assembly as claimed in claim 14, wherein said compliant layer is comprised of a low-modulus material and said flexible layer is comprised of a high-modulus material.

16. An integrated circuit package assembly as claimed in claim 9, wherein said plurality of lands are comprised of electrically conductive contact pads.

* * * * *